United States Patent
Bulante et al.

[19]

[11] Patent Number: 5,949,650
[45] Date of Patent: Sep. 7, 1999

[54] COMPOSITE HEAT SINK/SUPPORT STRUCTURE

[75] Inventors: Roderick A. Bulante; Gary L. Duncan, both of Torrance; Troy A. Conwell, Hawthrorne; Dennis Quan, South Pasadena; John P. Stafford, Yorba Linda; Sung H. Lee, Valencia, all of Calif.

[73] Assignee: Hughes Electronics Corporation, El Segundo, Calif.

[21] Appl. No.: 09/145,847

[22] Filed: Sep. 2, 1998

[51] Int. Cl.⁶ ..................................... H05K 7/20
[52] U.S. Cl. ................... 361/704; 361/707; 361/708; 361/719; 361/721; 361/752; 361/796; 174/16.1; 174/16.3; 165/80.2; 165/185
[58] Field of Search ................... 361/704, 705, 361/708, 709, 719, 720; 165/80.2, 80.3, 185; 174/250, 252, 255; 257/720

[56] References Cited

U.S. PATENT DOCUMENTS

| | | | |
|---|---|---|---|
| 4,689,110 | 8/1987 | Leibovitz | 216/20 |
| 4,812,792 | 3/1989 | Leibovitz | 333/238 |
| 4,849,858 | 7/1989 | Grapes et al. . | |
| 4,888,247 | 12/1989 | Zweben et al. | 428/105 |
| 4,963,414 | 10/1990 | LeVasseur et al. | 428/195 |
| 4,963,425 | 10/1990 | Buchanan et al. | 174/250 |
| 5,103,293 | 4/1992 | Bonafino et al. | 257/702 |
| 5,111,359 | 5/1992 | Montesano . | |
| 5,296,310 | 3/1994 | Kibler et al. . | |
| 5,390,734 | 2/1995 | Voorhes et al. | 165/185 |
| 5,424,916 | 6/1995 | Martin | 361/698 |
| 5,834,337 | 10/1998 | Unger et al. | 438/122 |

*Primary Examiner*—Leo P. Picard
*Assistant Examiner*—Boris L. Chervinsky
*Attorney, Agent, or Firm*—Georgann S. Grunebach; M. W. Sales

[57] ABSTRACT

A heat sink board structure includes a thermal/structural base having a composite core layer of a mass of graphitized carbon fibers infiltrated with a first resin material matrix. The graphitized carbon fibers of the composite core are substantially unidirectional and oriented parallel to the face of the composite core layer. Transverse reinforcement layers are bonded to the oppositely disposed faces of the composite core layer. Each transverse reinforcement layer is formed of carbon fibers embedded in a resin material matrix, with the carbon fibers lying substantially in a plane of the transverse reinforcement layer and perpendicular to the carbon fibers in the composite layer. Heat generating and heat dissipating components are bonded to the thermal/structural base. Metallic contact strips are bonded to the surfaces of the transverse reinforcement layers.

17 Claims, 3 Drawing Sheets

COMPOSITE HEAT SINK/SUPPORT STRUCTURE

BACKGROUND OF THE INVENTION

This invention relates to component supports and heat sinks for electronic applications, and, more particularly, to a structure that supports electronic components and heat sinks, provides a high-thermal-conductivity path therebetween, and is structurally strong.

In one widely used device architecture, electronic and microwave components are attached to support boards, and the support boards are housed on parallel guides in a chassis. The microelectronic components may be electrically interconnected both on the board, and between boards through electrical contacts at the edges of the boards or sometimes with jumpers between the boards. This general approach allows the components to be organized onto different boards according to their functions, and also allows for the quick replacement of a failed component by replacing the entire board on which the component is located.

For the case of high-power electronic and microwave devices, the limiting consideration in miniaturization and weight reduction of the device is often heat removal. The individual components produce heat, and that heat must be conveyed away so that the temperatures of the components do not exceed their maximum operating temperatures. As the sizes of the components become smaller and they are spaced more closely, the heat removal problem becomes more acute.

Heat may be conducted away from the components to heat sinks, radiators, or other heat dissipation components, or heat may be removed to the surrounding atmosphere. For devices to be used in space or which are located in hermetic packages, heat removal to the atmosphere may not be possible, and heat conduction to heat dissipation components is the only practical approach. Heat conduction requires the use of thermally conductive materials, many of which add substantial weight to the electronic structure. For space applications, weight reduction is a key consideration due to the cost of lifting weight to orbit.

There is therefore an ongoing need for improved electronic device structures which achieve increased heat removal with reduced weight. The present invention fulfills this need, and further provides related advantages.

SUMMARY OF THE INVENTION

The present invention provides a heat sink board structure for mounting heat generating components such as electronic and microwave components, and for mounting heat-dissipating components. The heat sink structure is structurally rigid and strong. These mechanical properties of the structure allow it to be made quite thin and light, yet with sufficient mechanical support for the mounted components. The design of the heat sink board structure may be optimized for maximum properties, minimum cost, or a balance of properties and cost. The heat sink board structure may be made at relatively low cost using the techniques discussed herein. With the proper selection of materials, the heat sink board structure is fully space qualified, with low evolution of volatiles in a space environment.

In accordance with the invention, a heat sink board structure comprises a thermal/structural base including a composite core layer comprising a mass of substantially unidirectionally oriented first carbon fibers infiltrated with a first resin material matrix. The composite core layer has a first face and a second face. A first transverse reinforcement layer is bonded to the first face of the composite core layer. The first transverse reinforcement layer is substantially planar and comprises second carbon fibers embedded in a second resin material matrix with the second carbon fibers lying substantially in the plane of the first transverse reinforcement layer. At least some of the second carbon fibers are not parallel to the first carbon fibers, and preferably the second carbon fibers are oriented perpendicular to the first carbon fibers. Preferably, the heat sink board structure further comprises a second transverse reinforcement layer bonded to the second face of the composite core layer. The second transverse reinforcement layer is substantially planar and comprises third carbon fibers embedded in a third resin material matrix with the third carbon fibers lying substantially in the plane of the second transverse reinforcement layer. At least some of the third carbon fibers are not parallel to the first carbon fibers, and preferably the third carbon fibers are oriented perpendicular to the first carbon fibers. Heat generating and heat dissipating components are typically attached to the thermal/structural base.

The first carbon fibers, which are desirably graphitized in a brick form, preferably constitute a high volume fraction, on the order of from about 80 to about 83 volume percent, of the composite core layer. The first carbon fibers are preferably oriented parallel to the plane of the first transverse reinforcement layer and so as to conduct heat in the direction toward a thermal sink board attachment at an edge of the thermal sink board.

The second and third carbon fibers, on the other hand, lie in the plane of their respective transverse reinforcement layers and are oriented at least in part transversely, preferably perpendicularly, to the first carbon fibers. These second and third carbon fibers serve to provide substantial structural stiffness and strength to the heat sink board transversely to the first carbon fibers and, to a lesser degree, reduce thermal gradients in the plane of the transverse reinforcement layers. The first, second, and third carbon fibers may be of the same or different forms and structures.

The resin matrix materials bind the respective carbon fibers together and also improve the strengths of the various layers. For space-qualified applications, the primary interest of the inventors, the resin matrix materials are selected to meet the outgassing specifications established for such applications. The first, second, and third resin matrix materials may be the same or different polymers, and may be either thermosetting or thermoplastic types.

The heat sink structures of the invention achieve substantially improved properties as compared with aluminum and copper heat sinks. The thermal conductivity is twice that of aluminum at only 60 percent of the weight of aluminum. The stiffness is three times that of aluminum, and the strength is twice that of aluminum. The thermal conductivity is 50 percent greater than copper at only 25 percent of the weight of copper.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
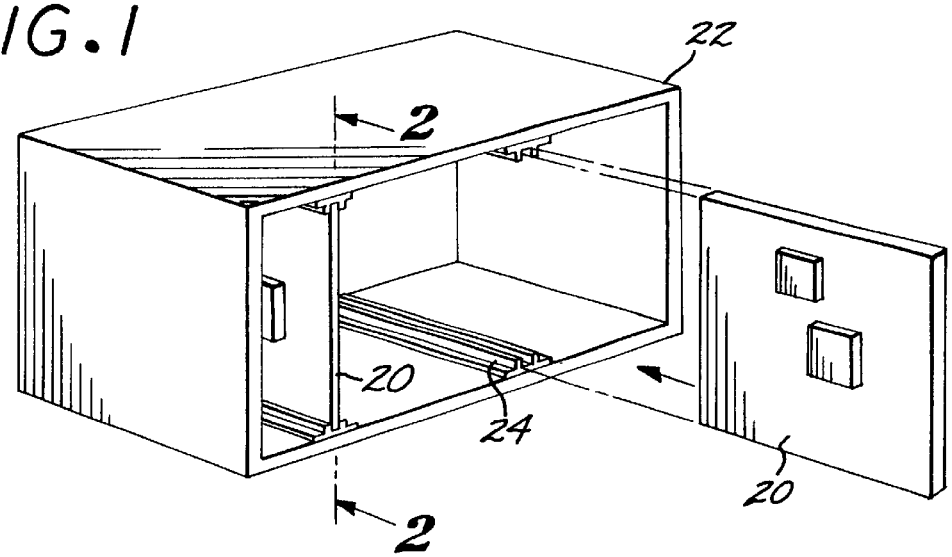
FIG. 1 is a perspective exploded view of a chassis and a heat sink board structure.

FIG. 1 illustrates a heat sink structure 20 that is a freestanding element, but which in service is inserted into a chassis 22 on slotted guides 24. FIG. 1 shows two such heat sink structures 20, one installed and one separated from the chassis 22 to illustrate the mode of installation. In practice, the chassis 22 would typically contain a larger number of such heat sink structures in the depicted parallel arrangement. Electrical connectors (not visible) in the side of the chassis 22 remote from the visible opening engage corresponding connectors on the heat sink structure 20 to accomplish electrical interconnects to the electronic circuitry on the heat sink structure 20.

Figure 3:
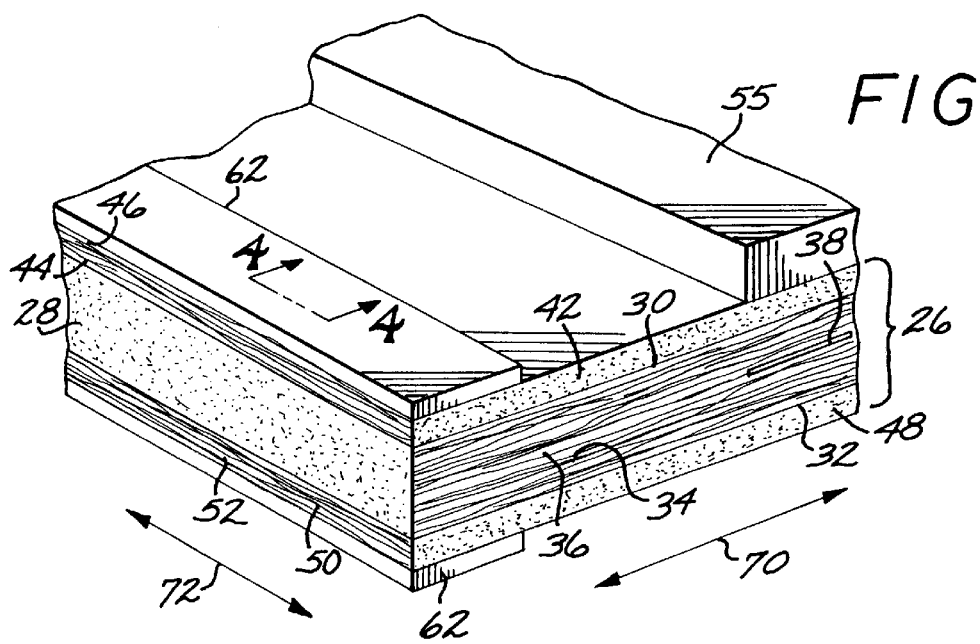
FIG. 3 is an enlarged schematic perspective view of a portion of FIG. 2.
Figure 4:
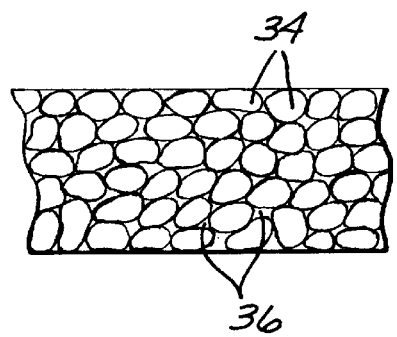
FIG. 4 is an enlarged sectional view of the composite core layer, taken along line 4—4 of FIG. 3.
Figure 2:
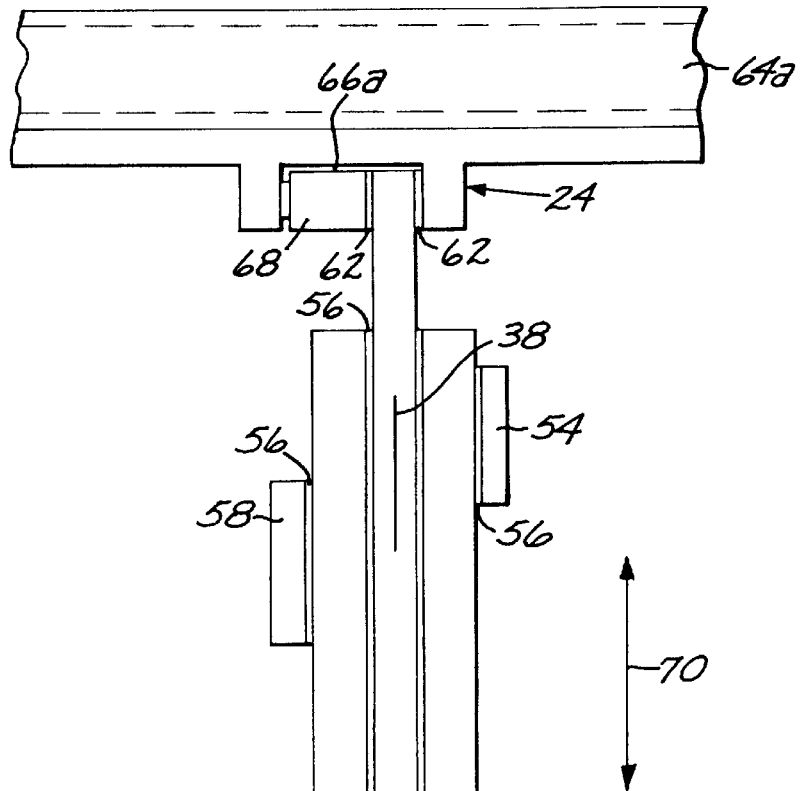
FIG. 2 is a sectional view of a portion of FIG. 1, taken along lines 2—2.
Figure 2:
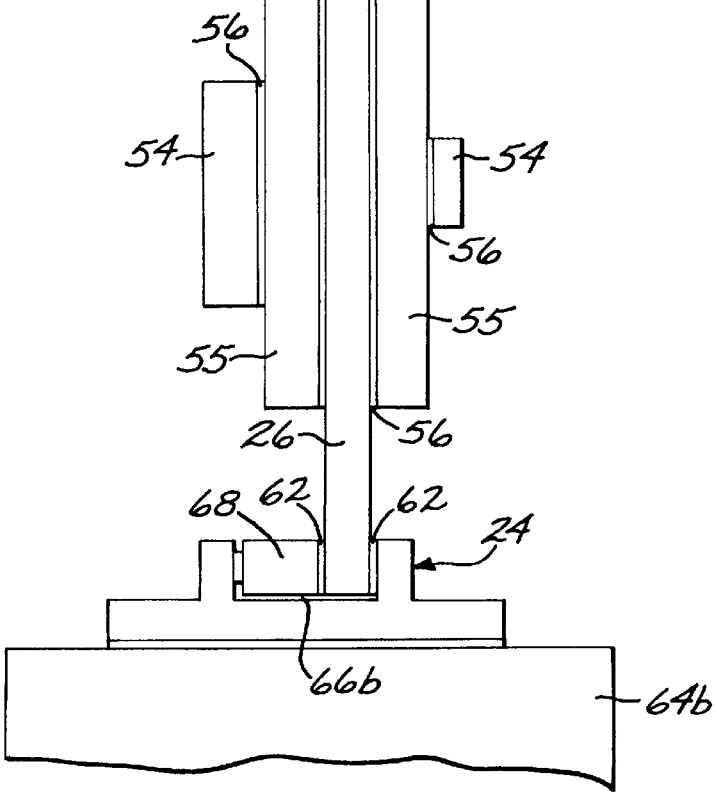
Figure 5:
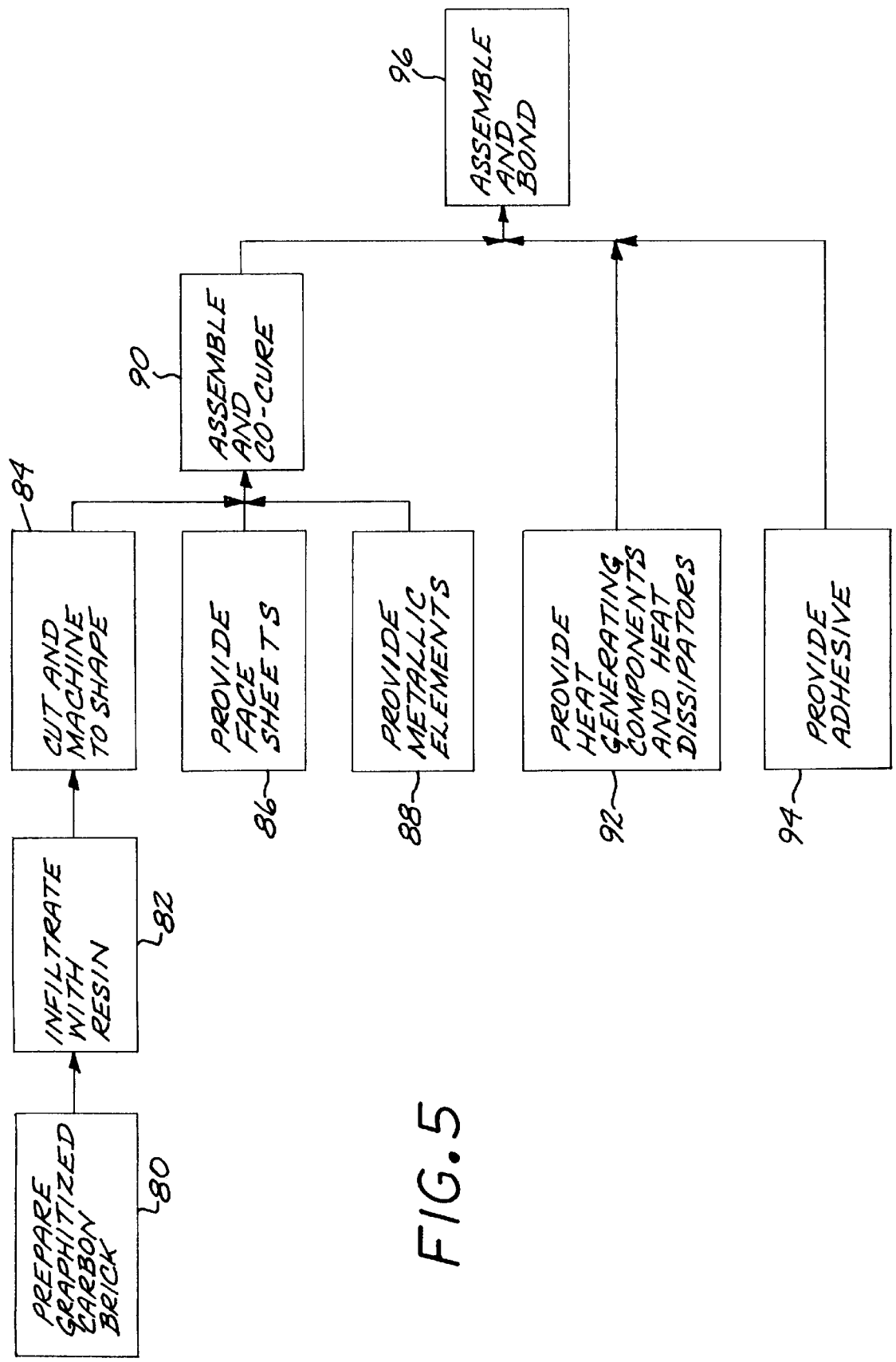
FIG. 5 is a block flow diagram of a method for preparing the heat sink board structure.

FIG. 2 shows the general structure of the heat sink structure 20. A thermal/structural base 26, also termed a "backbone", is shown in greater detail in FIG. 3. The thermal/structural base 26 includes a composite core layer 28 having a first face 30 and a second, oppositely disposed and parallel, face 32. As also shown in FIG. 4, the composite core layer 28 is formed of a mass of first carbon fibers 34, preferably graphitized carbon fibers, infiltrated with a first resin material matrix 36. The first carbon fibers 34 are substantially unidirectional. In FIG. 3, line 38 represents, on average, a direction parallel to the elongated first carbon fibers 34. Not all of the first carbon fibers 34 are perfectly parallel to line 34 due to the limitations of manufacturing technology, but this line represents an average orientation.

The first carbon fibers 34 may be of any operable type, but are preferably moderately high conductivity graphitized carbon fibers having a thermal conductivity parallel to the long direction of the carbon fibers of from about 650 watts/meter-°K to about 1200 watts/meter-°K. A most preferred first carbon fiber 34 is K1100 carbon fiber, having a thermal conductivity parallel to the long direction of the carbon fiber of about 1100 watts/meter-°K.

The first resin matrix material 36 may be any operable material, but is preferably cyanate ester resin. This resin is preferred for several reasons. It has a sufficiently low viscosity that it may be infiltrated into a carbon fiber "brick" during manufacturing, has good pot life, may be readily handled during manufacturing, has minimal toxicity, and is not strongly sensitive to temperature during manufacturing. The final product, after curing, meets NASA Specification SP-R-0022A and is therefore qualified for use in a spacecraft application. This specification requires that the total mass loss not exceed 1.0 percent and the proportion of condensable materials be not more than 0.10 percent, when tested by the method set forth in ASTM E595. This testing process is discussed in W. Campbell, Jr. and R. Marriott, *Outgassing Data for Selected Spacecraft Materials*, NASA Reference Publication 1124 Revised (1987), pages 1–3. This resin is also selected because after curing it is resistant to commonly used solvents, has good mechanical properties, meets vibration and thermal cycling requirements, and is of acceptable cost.

The first carbon fibers 34 occupy a high volume fraction of the composite core layer 28, in order to impart high thermal conductivity to the composite core layer 28. The first carbon fibers 34 preferably constitute at least about 80 volume percent of the composite core layer 28, more preferably from about 80 to about 83 volume percent, and most preferably about 83 volume percent. If the first carbon fibers 34 occupy a substantially smaller volume fraction, the thermal conductivity of the composite core layer 28 is undesirably low, although the material is still functional. If the first carbon fibers 34 occupy a substantially larger volume fraction than about 83 volume percent, the strength of the core layer 28 is reduced below that desired, because of the reduced amount of the infiltrated first resin matrix material, although the material is still functional. That is, the material is functional if the volume fraction lies outside this range of about 80–83 volume percent, but is less desirable. The presence of the first resin material matrix 36 imparts toughness and strength to the composite core layer 28.

A planar first transverse reinforcement layer 42 is bonded to the first face 30 of the composite core layer 28. The first transverse reinforcement layer 42 is formed of second carbon fibers 44 embedded in a second resin material matrix 46. The second carbon fibers 44 preferably lie substantially in the plane of the first transverse reinforcement layer 42. Preferably, at least some of the second carbon fibers 44 are oriented substantially perpendicular to the line 38 and thence to the first carbon fibers 34. Preferably, the second carbon fibers 44 are substantially unidirectional and are perpendicular to the first carbon fibers 34. The second carbon fibers 44 may be of any operable type, but are preferably P75 carbon fibers, which have a high compressive strength to offset the coefficient of thermal expansion of the composite core layer 28. The second resin material matrix 46 may be any operable material, but is also preferably cyanate ester resin. This cyanate ester resin is preferred because it is functional as a matrix material and meets the requirements of NASA Specification SP-R-0022A. The second carbon fibers 44 preferably constitute from about 40 to about 42 volume percent of the first transverse reinforcement layer 42, most preferably about 42 volume percent. This range represents a balance between mechanical and thermal conductivity properties. The material is functional if the volume fraction lies outside this range, but is less desirable.

The second carbon fibers 44 in the first transverse reinforcement layer 42 serve to stiffen, strengthen, and toughen the thermal/structural base in the bending direction perpendicular to the first carbon fibers 34. They also conduct heat and thence redistribute localized heat concentrations over the lateral extent of the face of the composite core layer 28, so that the heat is more effectively conducted away from heat sources mounted directly or indirectly to the composite core layer 28.

The material of the first transverse reinforcement layer 42 is preferably obtained commercially as a unidirectional prepreg material of about 40 minimum volume percent of carbon fibers, termed P75 carbon fibers, in a cyanate ester matrix, termed an RS-3 cyanate ester matrix. This material may be purchased as RS-3/P75S 2K unidirectional prepreg material from YLA Co., Benecia, Calif.

A second transverse reinforcement layer 48 is bonded to the second face 32 of the composite core layer 28. The second transverse reinforcement layer 48 is formed of third carbon fibers 50 embedded in a third resin material matrix 52. In general, the structure of the second transverse reinforcement layer 48 may be the same as or different than that of the first transverse reinforcement layer 42. However, most preferably it is of the same structure, materials, and orientation, and the above discussion of the first transverse reinforcement layer 42 is incorporated herein. In the preferred approach, the second carbon fibers 44 and the third carbon fibers 50 are of the same type, and the second resin material 46 and the third resin material 52 are of the same type.

At least one, and preferably several, heat-generating components 54 are bonded to the printed wiring boards 55, which are in turn bonded to the thermal/structural base 26. The heat-generating components 54 may be of any type and are thence illustrated generically, but typically include integrated circuit structures, discrete elements, ASICs, and the like. Optionally, heat-dissipating components 58 are bonded to the thermal/structural base 26, on the same or the opposite side thereof as the heat-generating components 54. The heat-dissipating components 58 may be of any type and are thence illustrated generically, but typically include radiators and the like, where present.

The printed wiring boards 55 may be bonded to the thermal/structural base 26 by any operable approach. The heat-generating components 54 and heat-dissipating components 58 may be bonded to the printed wiring boards 55 by any operable approach. Preferably, all of the bonds are formed using a thin adhesive layer 56. The adhesive layer 56 is preferably a laminate of glass fibers embedded in B-staged and cured epoxy, which is available as a film from Ablestick Adhesive, Gardena, Calif. This adhesive is preferred because it is operable and is space-qualified under NASA Specification SP-R-0022A, whose prior discussion is incorporated here.

Additional elements may optionally be bonded to the thermal/structural base 26, and one such additional element is illustrated in FIG. 2. To prevent abrasion when the heat sink structure 20 is inserted and removed from the guides 24, to serve as an electrical grounding contact, and to provide a heat flow path, thin copper strips 62 are bonded to the two sides of the thermal/structural base 26 at the ends thereof. The size of the copper bonded layer may be made larger, if desired, to serve as an electrical ground plane for the heat-generating components 54.

In a preferred embodiment, the composite core layer 28 is about 0.086 inch thick, the first transverse reinforcement layer 42 and the second transverse reinforcement layer 48 are each about 0.005 inch thick, and the copper strips 62 are each about 0.0014 inch thick. These dimensions are presented as illustrative of the preferred embodiment, but the invention is not limited to these thicknesses. The lateral extent of the thermal-structural base 26 is made as large as necessary to accommodate the heat-generating components 54 and the heat-dissipating components 58 mounted thereto.

As shown in FIG. 2, at each end the thermal/structural base 26 is attached to a heat conductor 64. In a preferred design, a first heat conductor 64a is a block that includes an internal heat pipe. A second heat conductor 64b is a block that may also contain an embedded heat pipe, but may instead be a solid heat conductor. The slotted guides 24 act as heat sink board attachments which are affixed to the respective heat conductors 64, and the ends of the thermal/structural base 26 are captured within slots 66 of the guides 24. A conventional wedgelock fastener 68 presses the faces of the copper strips 62 on the surfaces of the thermal/structural base 26 against the inside surfaces of the slots 66 to form a thermal and electrical contact.

A longitudinal direction 70 is defined extending between the first slot 66a of the first heat conductor 64a, at one end, and the second slot 66b of the second heat conductor 64b, at the other end. The line 38 substantially parallel to the first carbon fibers 34, and thence the first carbon fibers 34 themselves, is parallel to the longitudinal direction 70. In the preferred embodiment, the second carbon fibers 44 and the third carbon fibers 50 are all substantially parallel to a transverse direction 72, which is perpendicular to the longitudinal direction 70, and lies in the plane of the thermal/structural base 26. The second carbon fibers 44 and the third carbon fibers 50 therefore extend out of the plane of the illustration of FIG. 2.

The first carbon fibers 34 conduct heat from the central region of the thermal/structural base 26, where it is produced by the heat-generating components 54, toward the heat conductors 64 at each end of the thermal/structural base 26. The heat-dissipating components 58, where present, aid in dissipating any excess heat greater than that which can be conducted to the heat conductors 64. The transversely oriented carbon fibers 44 and 50 of the respective transverse reinforcing layers 42 and 48 impart stiffness, strength, and toughness to the thermal/structural base 26 when it is deformed by bending about the transverse direction 72.

FIG. 4 illustrates a preferred approach for fabricating the heat sink structure 20. A porous graphitized carbon brick is prepared and furnished, numeral 80. The brick is prepared by reacting mesophase pitch fibers to create a bulk article, which is thereafter formed to panels of the desired shape and size and heat treated to pyrolize/graphitize the carbon. This article has substantially unidirectional graphitized first carbon fibers 34 with open-celled porosity therebetween. Such a graphitized carbon brick is available commercially from AMOCO, Alpharetta, Ga. The graphitized carbon brick is rough trimmed to approximately the desired size and shape of the composite core layer 28, and desired orientation of the graphitized first carbon fibers in the composite core layer 28. An important advantage of this fabrication technique is that the orientation of the first carbon fibers may be readily established by this machining operation.

The first resin material for the first resin material matrix 36 is infiltrated into the porosity of the rough-trimmed graphitized carbon brick, numeral 82, by heating the brick and the resin to a temperature sufficiently high that the resin material flows and infiltrates into the porosity. In the case of the preferred cyanate ester resin, the infiltration is accomplished at a temperature of about 302° F. The infiltrated rough-trimmed graphitized carbon brick is thereafter final cut and machined to the desired final shape and size of the composite core layer 28, numeral 84.

The transverse reinforcement layers 42 and 48 are provided, numeral 86, preferably as unidirectional prepreg composite materials. The metallic elements, such as the copper strips 62, where used, are provided, numeral 88.

The composite core layer 28, transverse reinforcement layers 42 and 48, and metallic elements such as the copper strips 62 are assembled as illustrated in FIG. 2, preferably using appropriate tooling, and bonded together and co-cured, numeral 90. In the bonding and co-curing, the assembly is heated to a temperature sufficiently high to cause the resin materials to cure and to adhere to each other, their adjacent carbon fibers, and other structure such as the copper strips. This curing cycle is specified by the manufacturer for each type of resin material. For the preferred case, the bonding and co-curing is accomplished by heating to a temperature of about 285° F. for about 1 hour. The result of the assembling, bonding, and co-curing of step 90 is a finished thermal/structural base 26.

The heat generating components 54 and optional heat-dissipating components 58 are provided, numeral 92. These components are typically furnished already bonded to the printed wiring boards 55 by the adhesive 56. The nature of these components 54 and 58 is determined by the specific application. More of the adhesive 56 is furnished, numeral 94. The printed wiring boards 55 are assembled to the thermal/structural base 26 with the adhesive layers 56 therebetween, and then bonded, numeral 96. Bonding is accomplished in an autoclave at a temperature of 180° F. and for a time of 5 hours.

Prototype heat sink structures have been prepared according to the above-described structure and procedures and tested. The heat sink structures had a thermal conductivity of at least about 600 watts/meter-°K in the longitudinal direction 70, at least about 45 watts/meter-°K in the transverse direction 72, and at least about 7 watts/meter-°K in the through-thickness direction mutually perpendicular to the directions 70 and 72. Outgassing was measured to be less than 1 percent TML (total mass loss) and less than 0.1 percent CVCM (condensable material), as measured according to ASTM E595. The heat sink structures therefore were acceptable for use in a space environment, an important advantage resulting from the careful selection of resins and adhesives. The heat sink structures had excellent mechanical properties. For example, the longitudinal tensile strength parallel to the longitudinal direction 70 was at least about 35,000 pounds per square inch (psi), and the transverse tensile strength parallel to the transverse direction 72 was at least about 7,000 psi. The longitudinal tensile elastic Young's modulus parallel to the longitudinal direction 70 was at least about $70 \times 10^6$ psi, and the transverse tensile elastic Young's modulus parallel to the transverse direction 72 was at least about $2 \times 10^6$ psi. The longitudinal flexural strength about the longitudinal axis 70 was at least about 40,000 psi, and the transverse flexural strength about the transverse axis 72 was at least about 14,000 psi. The longitudinal elastic flexural modulus about the longitudinal axis 70 was at least about $48 \times 10^6$ psi, and the transverse elastic flexural modulus about the transverse axis 72 was at least about $5 \times 10^6$ psi. These properties are all satisfactory to allow the heat sink structures to be utilized in spacecraft applications.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A heat sink board structure, comprising a thermal/structural base including:
   a composite core layer comprising a mass of substantially unidirectionally oriented first carbon fibers infiltrated with a first resin material matrix, the composite core layer having a first face and a second face; and
   a first transverse reinforcement layer bonded to the first face of the composite core layer, the first transverse reinforcement layer being substantially planar and comprising second carbon fibers embedded in a second resin material matrix with the second carbon fibers lying substantially in the plane of the first transverse reinforcement layer, at least some of the second carbon fibers being nonparallel to the first carbon fibers.

2. The heat sink board structure of claim 1, further including a heat generating component bonded to the thermal/structural base.

3. The heat sink board structure of claim 1, further including a heat dissipating component bonded to the thermal/structural base.

4. The heat sink board structure of claim 1, wherein the first carbon fibers are graphitized.

5. The heat sink board structure of claim 1, wherein the second carbon fibers are substantially unidirectional and are perpendicular to the first carbon fibers.

6. The heat sink board structure of claim 1, wherein the first carbon fibers lie substantially parallel to the plane of the first transverse reinforcement layer.

7. The heat sink board structure of claim 1, wherein the first carbon fibers have a thermal conductivity of from about 650 watts/meter-°K to about 1200 watts/meter-°K.

8. The heat sink board structure of claim 1, wherein the first carbon fibers occupy from about 80 volume percent to about 83 volume percent of the composite core layer.

9. The heat sink board structure of claim 1, wherein the thermal/structural base has an outgassing of less than 1 percent total mass loss and less than 0.1 percent condensable material.

10. The heat sink board structure of claim 1, further including
    a metallic contact strip bonded to a surface of the first transverse reinforcement layer.

11. The heat sink board structure of claim 1, further including
    a second transverse reinforcement layer bonded to the second face of the composite core layer, the second transverse reinforcement layer being substantially planar and comprising third carbon fibers embedded in a third resin material matrix with the third carbon fibers lying substantially in the plane of the second transverse reinforcement layer, at least some of the third carbon fibers being nonparallel to the first carbon fibers.

12. A heat sink board structure, comprising
    a thermal/structural base including:
      a heat sink board attachment;
      a composite core layer contacting the heat sink board attachment, the composite core layer comprising a mass of substantially unidirectionally oriented first graphitized carbon fibers infiltrated with a first resin material matrix and extending toward the heat sink board attachment, the composite core layer having a first face and a second face, and
    a planar first transverse reinforcement layer bonded to the first face of the composite core layer, the first transverse reinforcement layer comprising substantially unidirectionally oriented second carbon fibers embedded in a second resin material matrix, the second carbon fibers lying substantially in the plane of the first transverse reinforcement layer and perpendicular to the first graphitized carbon fibers, and
    a planar second transverse reinforcement layer bonded to the second face of the composite core layer, the second transverse reinforcement layer comprising substantially unidirectionally oriented third carbon fibers embedded in a third resin material matrix, the third carbon fibers lying substantially in the plane of the second transverse reinforcement layer and perpendicular to the first graphitized carbon fibers; and
    a heat generating component bonded to the thermal/structural base.

13. The heat sink board structure of claim 12, further including
    a heat dissipating component bonded to the thermal/structural base.

14. The heat sink board structure of claim 12, wherein the first carbon fibers have a thermal conductivity of from about 650 watts/meter-°K to about 1200 watts/meter-°K.

15. The heat sink board structure of claim 12, wherein the first carbon fibers occupy from about 80 volume percent to about 83 volume percent of the composite core layer.

16. The heat sink board structure of claim 12, further including a metallic contact strip bonded to a surface of the first transverse reinforcement layer.

17. The heat sink board structure of claim 12, wherein the thermal/structural base has an outgassing of less than 1 percent total mass loss and less than 0.1 percent condensable material.

* * * * *